(12) United States Patent
Taylor

(10) Patent No.: US 9,385,159 B2
(45) Date of Patent: Jul. 5, 2016

(54) ELECTRONIC CIRCUITRY HAVING SUPERCONDUCTING TUNNEL JUNCTIONS WITH FUNCTIONAL ELECTROMAGNETIC-RESPONSIVE TUNNELING REGIONS

(71) Applicant: The United States of America as represented by the Secretary of the Navy, Washington, DC (US)

(72) Inventor: Benjamin J. Taylor, San Diego, CA (US)

(73) Assignee: The United States of America as represented by the Sercretary of the Navy, Washington, DC (US)

( * ) Notice: Subject to any disclaimer, the term of this patent is extended or adjusted under 35 U.S.C. 154(b) by 101 days.

(21) Appl. No.: 14/319,112

(22) Filed: Jun. 30, 2014

(65) Prior Publication Data

US 2015/0380631 A1  Dec. 31, 2015

(51) Int. Cl.
H01L 27/18 (2006.01)
H01L 39/02 (2006.01)
H01L 39/12 (2006.01)
H01L 39/22 (2006.01)

(52) U.S. Cl.
CPC .............. *H01L 27/18* (2013.01); *H01L 39/025* (2013.01); *H01L 39/126* (2013.01); *H01L 39/225* (2013.01)

(58) Field of Classification Search
CPC ......... B82Y 10/00; B82Y 15/00; B82Y 30/00
USPC .................. 324/244, 248, 301, 149; 257/421; 427/126.5
See application file for complete search history.

(56) References Cited

U.S. PATENT DOCUMENTS

| 4,585,999 A | 4/1986 | Hilbert et al. |
| 6,690,162 B1 | 2/2004 | Schopohl et al. |
| 7,369,093 B2 | 5/2008 | Oppenlander et al. |
| 7,440,490 B2 | 10/2008 | Kidiyarova-Shevchenko et al. |
| 7,969,178 B2 | 6/2011 | Przybysz et al. |

(Continued)

OTHER PUBLICATIONS

Leblanc, L.J. et al, "Dynamics of a Tunable Superfluid Junction," Physical Review Letters, vol. 106, Jan. 2011.

(Continued)

*Primary Examiner* — David Vu
*Assistant Examiner* — Jonathan Han
(74) *Attorney, Agent, or Firm* — SPAWAR Systems Center Pacific; Kyle Eppele; Ryan J. Friedl

(57) ABSTRACT

A device includes at least one superconducting tunnel junction having a junction region comprising a junction barrier material responsive to electromagnetic fields within the MHz to THz range. The junction may be contained within a bi-SQUID loop having two main junctions and a center junction. The junction barrier material for the main junctions may have different electromagnetic-responsive properties than the junction barrier material for the center junction. The junction barrier material may include type-I multiferroics, type-II multiferroics, a composite multiferroic including layers of magnets and ferroelectrics, or piezoelectric materials. An array of connected bi-SQUID loops may be formed, where the main junctions of each bi-SQUID loop in each row are connected. The electromagnetic-responsive properties of the junction barrier material for center junctions of each bi-SQUID loop may vary by each array column or row. The center/main junctions of each bi-SQUID loop may be connected to an input signal line.

20 Claims, 8 Drawing Sheets

(56) References Cited

U.S. PATENT DOCUMENTS

| | | | |
|---|---|---|---|
| 8,179,133 B1 | 5/2012 | Kornev et al. | |
| 2007/0241747 A1* | 10/2007 | Morley | G01R 33/0354 365/162 |
| 2012/0172234 A1* | 7/2012 | Frantti | C04B 35/462 505/234 |
| 2013/0096825 A1* | 4/2013 | Mohanty | G01C 21/165 701/472 |

OTHER PUBLICATIONS

Gajek, M. et al., "Tunnel Junctions With Multiferroic Barriers," Nature Materials, vol. 6, pp. 296-302, Apr. 2007.

Cojocaru, V-C., "Nanoscale Paterning of Functional Perovskite-type Complex Oxides by Pulsed Laser Deposition Through a Nanostencil," Applied Surface Science, vol. 256, pp. 4777-4783, 2010.

Lehman, J., et al, "Domain Engineered Pyrroelectric Radiometer," Applied Optics, vol. 38, No. 34, pp. 7047-7055, 1999.

Thomson, R.R. et al., "Optical waveguide fabrication in z-cut lithium niobate ( $LiNbO_3$) using femtosecond pulses in the low repetition rate regime", Applied Physics Letters, vol. 88, p. 111109, 2006.

Rouvaen, J.M. et al., "Simultaneous generation of longitudinal and shear bulk ultrasonic waves in solids," Journal of Physics: D, Applied Physics, vol. 33, pp. 1287-1297, 2000.

Daumont, C.J.M, "Multiferroic perovskites under epitaxial strain: The case of $TbMnO_3$ thin films," PhD. Thesis, Zernike Institute for Advanced Materials Ph.D. Thesis series Aug. 2009, 2009.

* cited by examiner

ELECTRONIC CIRCUITRY HAVING SUPERCONDUCTING TUNNEL JUNCTIONS WITH FUNCTIONAL ELECTROMAGNETIC-RESPONSIVE TUNNELING REGIONS

FEDERALLY SPONSORED RESEARCH AND DEVELOPMENT

The Electronic Circuitry Having Superconducting Tunnel Junctions with Functional Electromagnetic-Responsive Tunneling Regions is assigned to the United States Government. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil. Reference Navy Case No. 102229.

BACKGROUND

The performance of existing superconducting circuitry based on the physics of Josephson tunneling is wholly dependent upon intrinsic properties of the superconducting material and the physical characteristics of the junction region that are fixed once a junction is physically formed. It is desirable to have circuitry where the tunneling environment is not fixed, but rather may be responsive and/or controllable based upon a magnetic and/or electric field.

DETAILED DESCRIPTION OF SOME EMBODIMENTS

Figure 1:
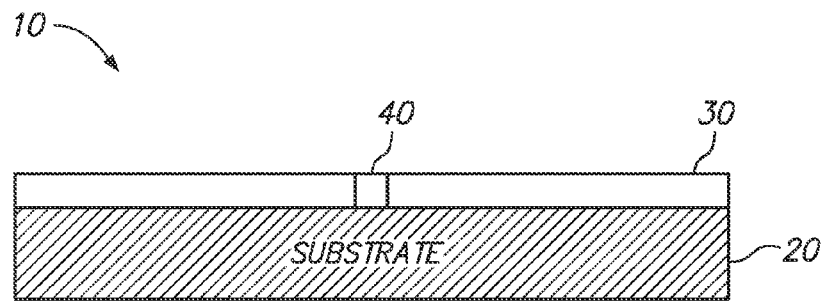
FIG. 1 shows a cross-section of an embodiment of a device comprising a substrate having a superconducting material with an in-plane tunnel junction with electromagnetic-responsive properties.

Reference in the specification to "one embodiment" or to "an embodiment" means that a particular feature, structure, or characteristic described in connection with the embodiments is included in at least one embodiment of the invention. The appearances of the phrases "in one embodiment", "in some embodiments", and "in other embodiments" in various places in the specification are not necessarily all referring to the same embodiment or the same set of embodiments.

The embodiments of the system and method disclosed herein aim to functionalize and/or control the tunneling environment such that the parameters which govern the physics of the tunneling process are no longer fixed entities, but rather are dependent upon responsive and/or controllable properties of the material which forms the tunneling barrier.

Existing superconducting electronic circuits and devices that exploit the properties of superconducting tunnel junctions (i.e. Josephson junctions, (JJs)) may be usefully modified by inserting structurally compatible complex functional materials into the junction region. By inserting such materials into a superconducting tunnel junction, the physical properties of the barrier material modifies the tunneling environment via changes in the symmetry of the tunneling potential and/or by imparting frequency dependencies on tunneling parameters that are constants in conventional JJs, e.g., the electrical conductivity of the normal state. The end result will be that the pre-existing superconducting circuitry will have an added mechanism of control and a particular sensitivity to the inherent frequency dependent properties of the barrier material.

Additionally, it is anticipated that since this new class of circuitry is based upon functionalized superconducting tunnel junctions wherein the usually fixed physical parameters governing the tunneling properties, and hence characteristic performance of the junctions, can be tuned discretely or continuously on-chip by applied localized magnetic or electric fields, such as a DC and/or RF magnetic or electric field. This will enable control of the current-voltage linearity of the circuit and/or device.

Many applications are possible from such direct control of linearity. For example, devices such as superconducting quantum interference devices may benefit from the incorporation of externally RF excitable junction regions and/or on-chip control of the physical tunneling parameters by introducing an enhanced or suppressed voltage output dependent on the frequency of incident RF radiation, by increasing the range of linear voltage output to an applied magnetic field, and subsequently RF signal sensitivity and amplification, and by potentially extending the sensitivity of the device towards the single photon limit at frequencies in the GHz range. Additionally, superconducting quantum memory devices such as those employing the rapid single flux quantum design may be enhanced with the introduction of an additional means of control of circuit performance and functionality.

FIG. 1 shows a cross-section of an embodiment of a device 10 comprising a substrate 20 having a superconducting material 30 with an in-plane superconducting tunnel junction 40 with electromagnetic-responsive properties. As an example, device 10 may be manufactured using any of the processes shown in FIGS. 8-11 and described herein. However, other methods for manufacturing device 10 known to a person having ordinary skill in the art may be used.

Superconducting tunnel junction 40 has a junction region comprising a superconducting junction barrier material having physical properties that are responsive to electromagnetic fields ranging from MHz to THz frequencies. Materials that are electromagnetically (and/or acoustically) responsive are those whose characteristic physical properties change under exposure to AC electric and/or magnetic fields, to incident RF electromagnetic waves, or to acoustic excitations. Such properties include, but are not limited to, electric permittivity, magnetic permeability, electrical conductivity, electro-mechanical, optical transmission, etc. Changes to such properties are often a function of frequency.

As an example, for TbMnO3 (at 80 K) at frequencies between 10 kHz-1 MHz, the real part of the dielectric constant and the electrical conductivity decreases/increases by two orders of magnitude, respectively. Additionally, the dielectric constant (T<50K) exhibits a significant resonant feature at 6 GHz. Further, the material LiNbO3 exhibits useful responsive properties from the Hz to the THz range. The acoustic frequency response in the Hz regime exhibits a peak at 90 Hz. In the 50 MHz-1 GHz frequency range, $LiNbO_3$ may be used in piezoelectric transducers. $LiNbO_3$ may also be used in free space and integrated optical applications in both passive and active devices. Its index of refraction is highly dependent upon mechanical stress and applied electric fields. At cryogenic temperatures, the properties of $LiNbO_3$ are such that devices based upon this material will still be able to operate at low temperatures and in some cases performance will be significantly enhanced.

In some embodiments, the multiferroic superconducting junction barrier material is structurally compatible for growth of films directly upon the superconducting material. In some embodiments, the film growth conditions of the multiferroic superconducting junction barrier material overlap with that of the superconducting material of the junction.

In some embodiments, the superconducting junction barrier material is a multiferroic material selected from the group of naturally-occurring multiferroics consisting of type-I multiferroics and type-II multiferroics. The group of type-I multiferroics contains those materials in which ferroelectricity and magnetism have different physical origins and coexist in a largely independently manner, with a small amount of coupling between them. The group of type-II multiferroics comprises materials in which magnetism causes ferroelectricity, with a strong coupling between the two.

In some embodiments, the superconducting junction barrier material comprises a composite multiferroic that includes layers of known magnets and ferroelectrics. In some embodiments, the superconducting junction barrier material is comprised of high-Tc cuprate based superconductors. In other embodiments, other classes of superconductors may be used. As an example, the superconducting junction barrier material is $TbMnO_3$ or $BiFeO_3$.

In some embodiments, the superconducting junction barrier material (or an overlaying/underlying region adjacent to the junction) comprises a piezoelectric material such as $LiNbO_3$, $LiTaO_3$ or $Pb(Mg_{1/3}Nb_{2/3})_{1-x}Ti_xO_3$. Embodiments using a piezo-electric material allow for the creation of, as an example, a very sensitive acoustic sensor.

The frequency dependent response of the material in the junction region adds a new functionality to the well-known physical parameters that govern the superconducting electron pair tunneling process, i.e., the Josephson plasma frequency, the barrier potential height, the chemical potential, the dimensions of the junction barrier, etc. In a conventional superconducting Josephson junction, these parameters are fixed once the junction region is fabricated. By introducing a barrier material having appropriate properties that are responsive to electromagnetic fields, the functionality of the barrier material will allow tunneling parameters that were previously fixed to become tunable and/or controllable.

Figures 2, 3:
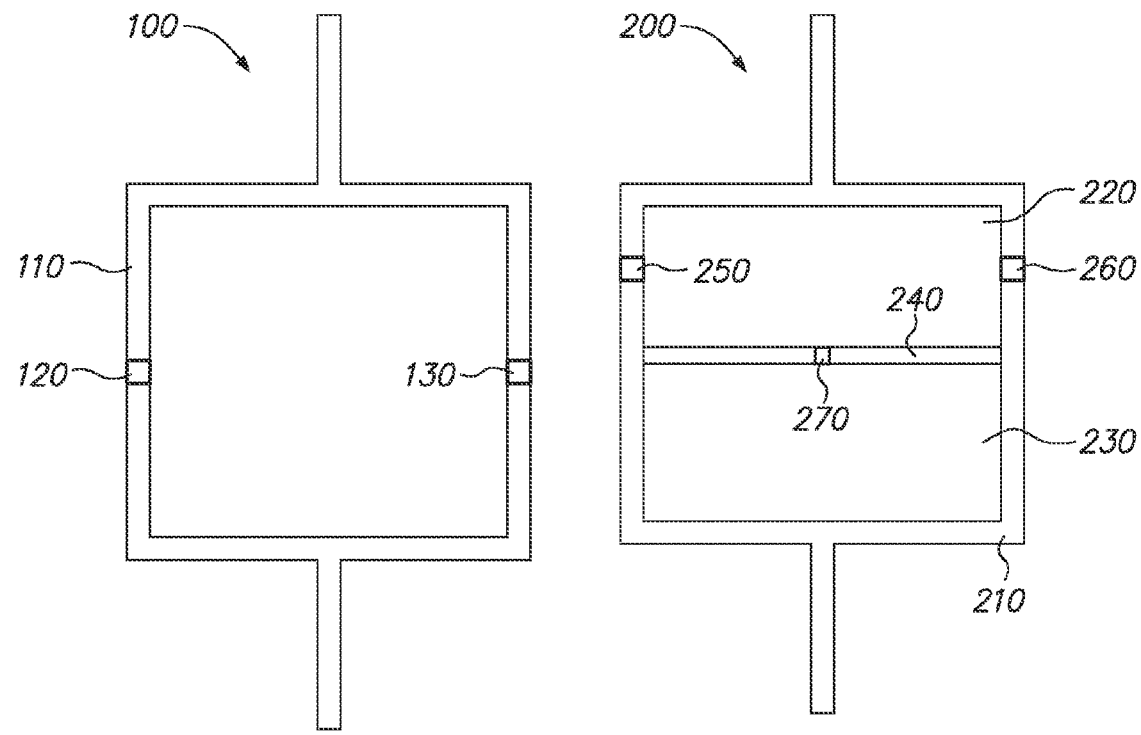
FIG. 2 shows a diagram illustrating an embodiment of a single SQUID loop having tunnel junctions with electromagnetic-responsive properties.
FIG. 3 shows a diagram illustrating an embodiment of a bi-SQUID loop having main tunnel junctions and a center junction with electromagnetic-responsive properties.

FIG. 2 shows a diagram 100 illustrating an embodiment of a single SQUID loop 110 having superconducting tunnel junctions 120 and 130 with electromagnetic-responsive properties. As an example, superconducting tunnel junctions 120 and 130 may be in-plane as similarly shown in device 10 of FIG. 1.

FIG. 3 shows a diagram 200 illustrating an embodiment of a bi-SQUID loop 210, comprising a first loop 220 and a second loop 230 separated by divider 240, having main tunnel junctions 250 and 260 and a center junction 270 with electromagnetic-responsive properties. In some embodiments, superconducting tunnel junctions 250 and 260 may be in-plane as similarly shown in device 10 of FIG. 1. In some embodiments, superconducting tunnel junctions 250 and 260 may have different electromagnetic-responsive properties than center junction 270. In some embodiments, superconducting tunnel junctions 250 and 260 may have similar electromagnetic-responsive properties as center junction 270. The differences in electromagnetic-responsive properties may be achieved by using different multiferroic or piezoelectric materials.

Figure 4:
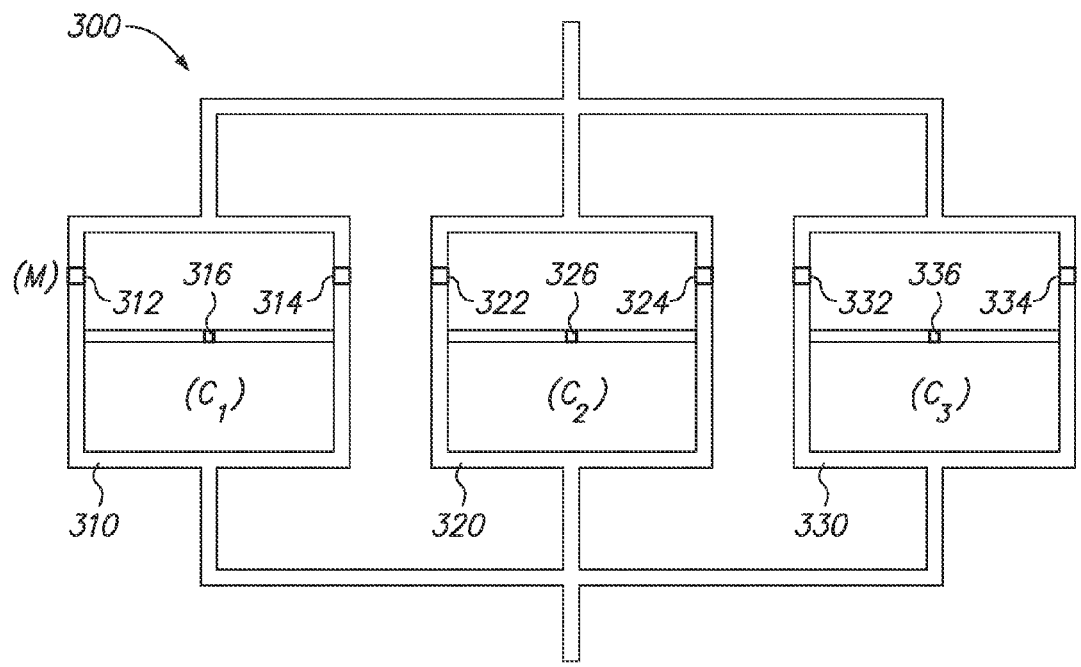
FIG. 4 shows a diagram illustrating interconnected bi-SQUID loops having main tunnel junctions and a center junction with electromagnetic-responsive properties.

FIG. 4 shows a diagram 300 illustrating interconnected bi-SQUID loops having main tunnel junctions and a center junction with electromagnetic-responsive properties. As shown, bi-SQUID loops 310, 320, and 330 are connected in parallel. Loop 310 has main junctions 312 and 314 and a center junction 316. Loop 320 has main junctions 322 and 324 and a center junction 326. Loop 330 has main junctions 332 and 334 and a center junction 336. In some embodiments, main junctions 312, 314, 322, 324, 332, and 334 are comprised of the same material. Center junctions 316, 326, and 336 are comprised of a material having different electrical/magnetic properties than the main junctions. In some embodiments, each of center junctions 316, 326, and 336 are comprised of materials giving them different electromagnetic-responsive properties than the other of the center junctions.

Figure 5:
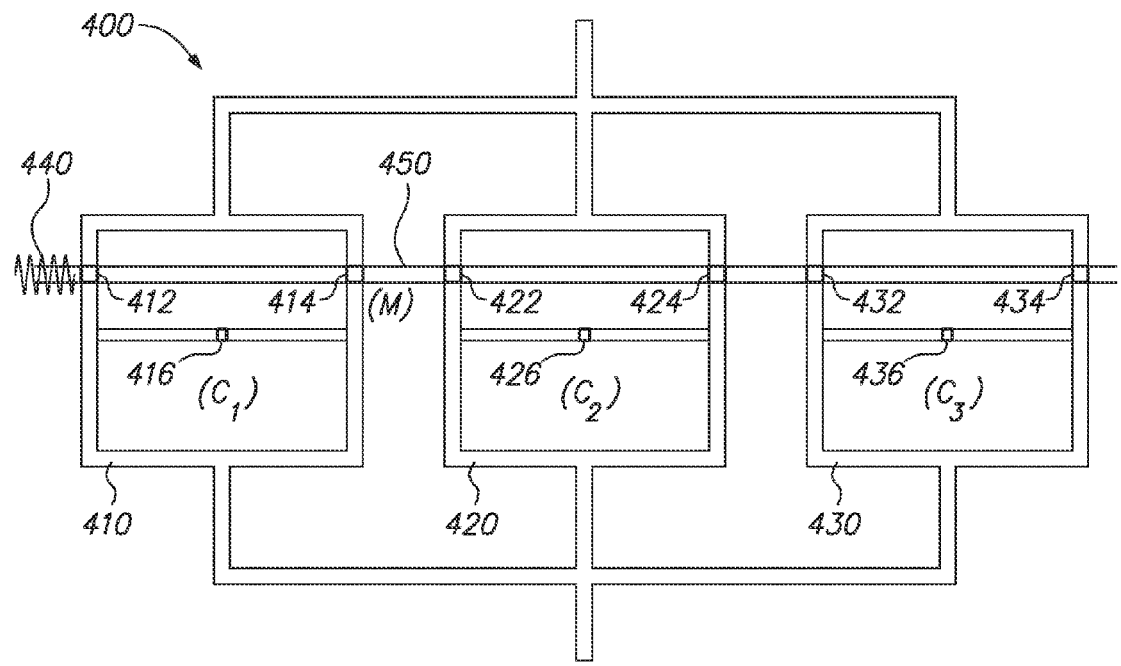
FIG. 5 shows a diagram illustrating interconnected bi-SQUID loops having main tunnel junctions and an electrically insulating center junction with electromagnetic-responsive properties, where an input signal is used to excite the electromagnetic-responsive material.

FIG. 5 shows a diagram 400 illustrating interconnected bi-SQUID loops having main tunnel junctions and a center junction with electromagnetic-responsive properties. As shown, bi-SQUID loops 410, 420, and 430 are connected in parallel. Loop 410 has main junctions 412 and 414 and a center junction 416. Loop 420 has main junctions 422 and 424 and a center junction 426. Loop 430 has main junctions 432 and 434 and a center junction 436. In some embodiments, main junctions 412, 414, 422, 424, 432, and 434 are comprised of the same material. Center junctions 416, 426, and 436 are comprised of a material having different electrical/magnetic properties than the main junctions. In some embodiments, each of center junctions 416, 426, and 436 are comprised of materials giving them different electromagnetic-responsive properties than the other of the center junctions.

An input signal 440 is used to excite the electromagnetic-responsive material connection 450 connecting main junctions 412, 414, 422, 424, 432, and 434. Material connection 450 may be comprised of the same electromagnetic-responsive material as main junctions 412, 414, 422, 424, 432, and 434. As an example, material connection 450 may overlap/underlay the junction regions. In some embodiments, input signal 440 is an electrical signal. In some embodiments, input signal 440 is a magnetic signal. In some embodiments, input signal 440 is produced by a device located within the same circuitry and/or on the same chip as loops 410, 420, and 430.

Figure 6:
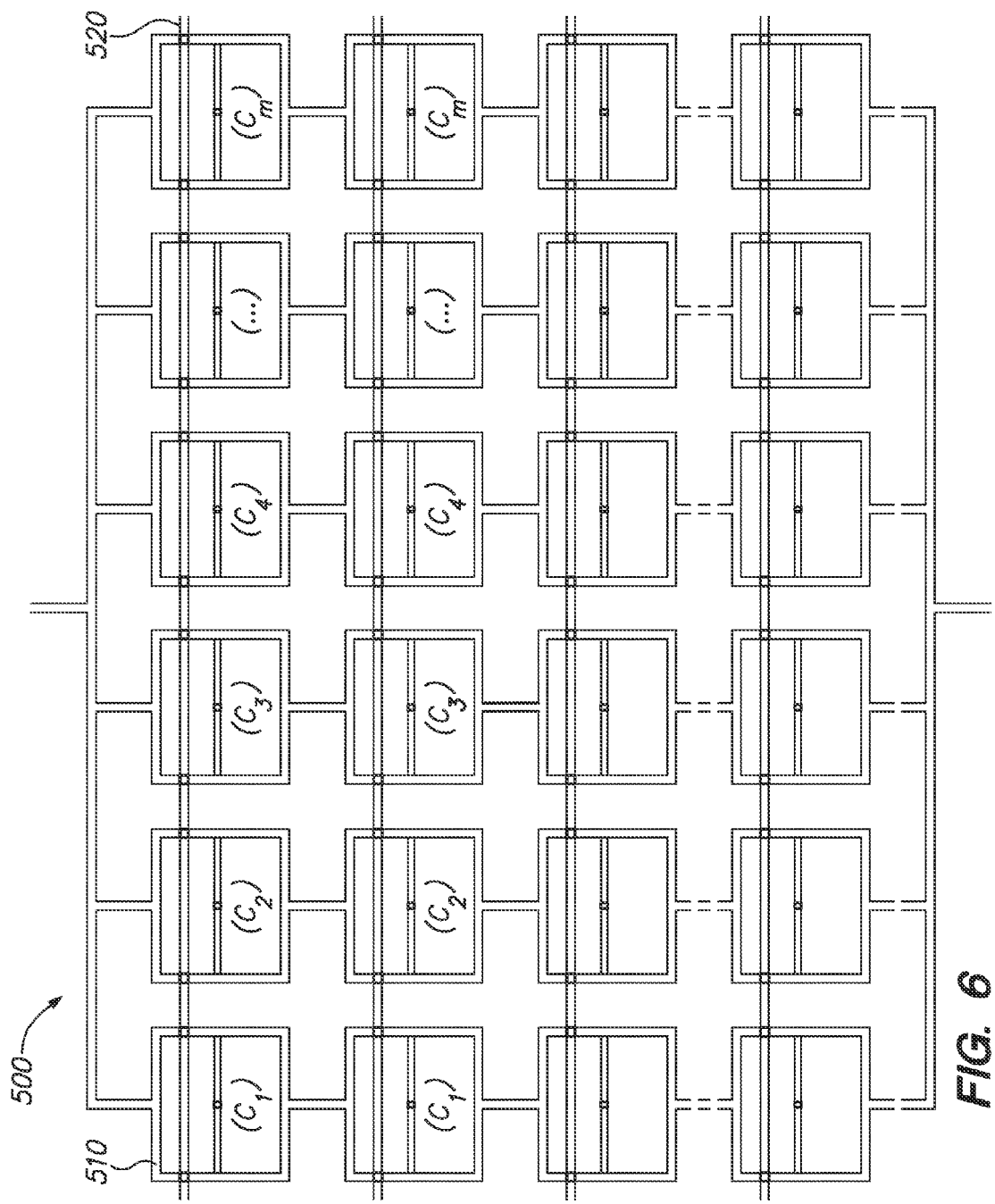
FIG. 6 shows a diagram illustrating an array of interconnected bi-SQUID loops having main tunnel junctions and a center junction with electromagnetic-responsive properties, where the main tunnel junctions are connected and the center junction varies by column.

FIG. 6 shows a diagram 500 illustrating an array of interconnected bi-SQUID loops 510 having main tunnel junctions and a center junction with electromagnetic-responsive properties. As shown, each column of loops 510 is connected in parallel. However, other array configurations, such as a series column configuration, are possible. As an example, loops 510 may be configured similarly as loops 410, 420, and 430 shown in FIG. 5, and may have a similar material connection 520 to connect the main junctions of loops 510. As shown, the electrical/magnetic properties of the center junctions of loops 510 vary by column, giving each column a distinct frequency behavior. For example, the first column of connected loops has loops with center junctions ($C_1$) of a first set of electrical/magnetic properties, the second column has loops with center junctions ($C_2$) of a second set of electrical/magnetic properties, and the last column has loops with center junctions ($C_m$) of an $m^{th}$ set of electrical/magnetic properties.

Figure 7:
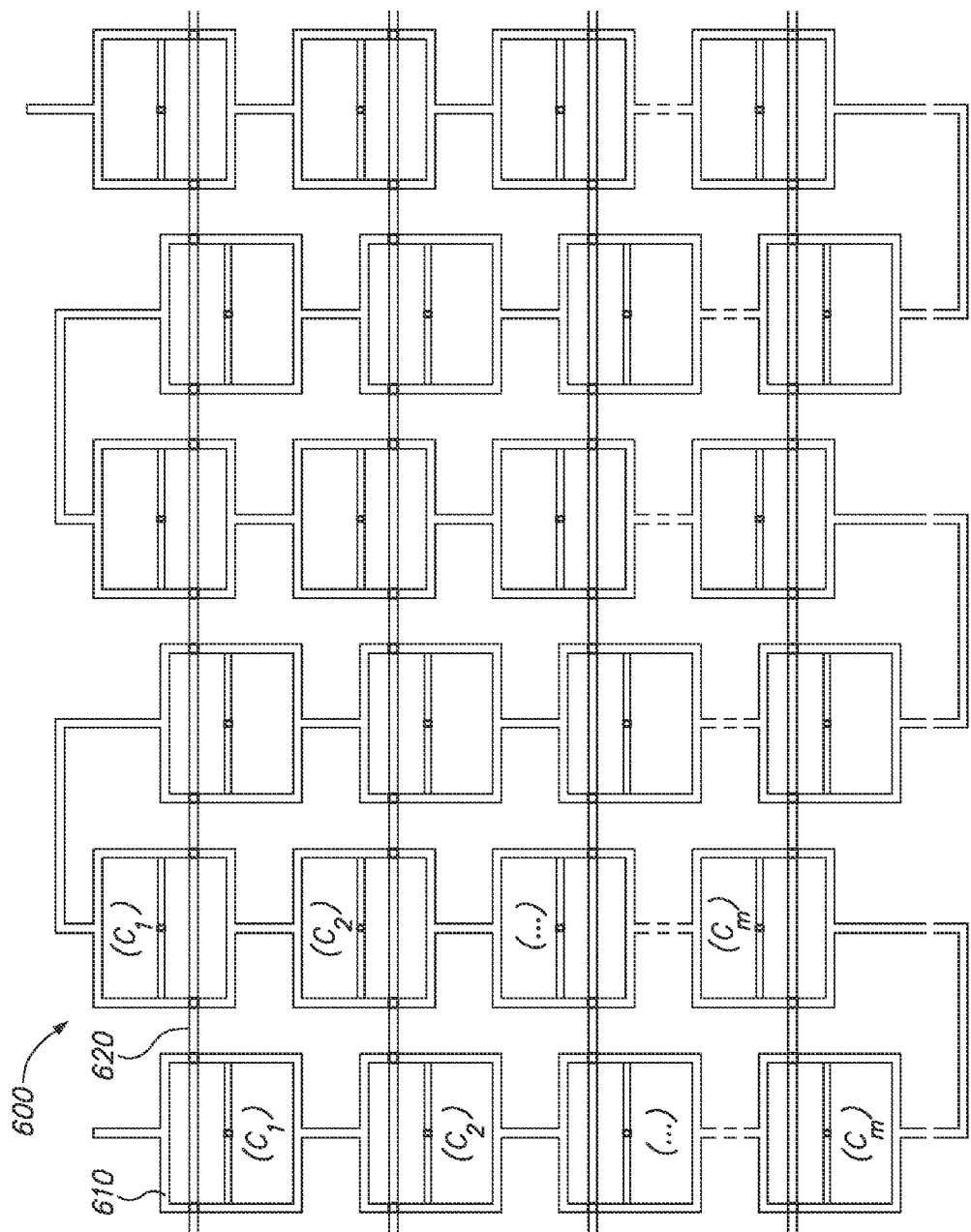
FIG. 7 shows a diagram illustrating an array of interconnected bi-SQUID loops having main tunnel junctions and a center junction with electromagnetic-responsive properties, where the main tunnel junctions are connected and the center junction varies by row.

FIG. 7 shows a diagram 600 illustrating an array of interconnected bi-SQUID loops 610 having main tunnel junctions and a center junction with electromagnetic-responsive properties. As shown, each column of loops 610 is connected in series. However, other array configurations, such as a parallel column configuration, are possible. As an example, loops 610 may be configured similarly as loops 410, 420, and 430 shown in FIG. 5, and may have a similar electromagnetic-responsive material connection 620 to connect the main junctions of loops 610. As shown, the electrical/magnetic properties of the center junctions of loops 610 vary by row. For example, the first row of connected loops 610 has loops with center junctions ($C_1$) of a first set of electrical/magnetic properties, the second row has loops with center junctions ($C_2$) of a second set of electrical/magnetic properties, and the last row has loops with center junctions ($C_m$) of an $m^{th}$ set of electrical/magnetic properties.

Although FIGS. 6 and 7 show two embodiments of arrays of bi-SQUID loops having interconnected junctions with electromagnetic-responsive properties, in other embodiments the layout of such arrays may be varied. For example, the layout of the arrays may be varied to alter the pattern of the junction correlation as desired. Further, the pattern of the materials used in each center junction $C_j$ may be varied, for example, to control the total circuit linearity and frequency characteristics.

Figure 8:
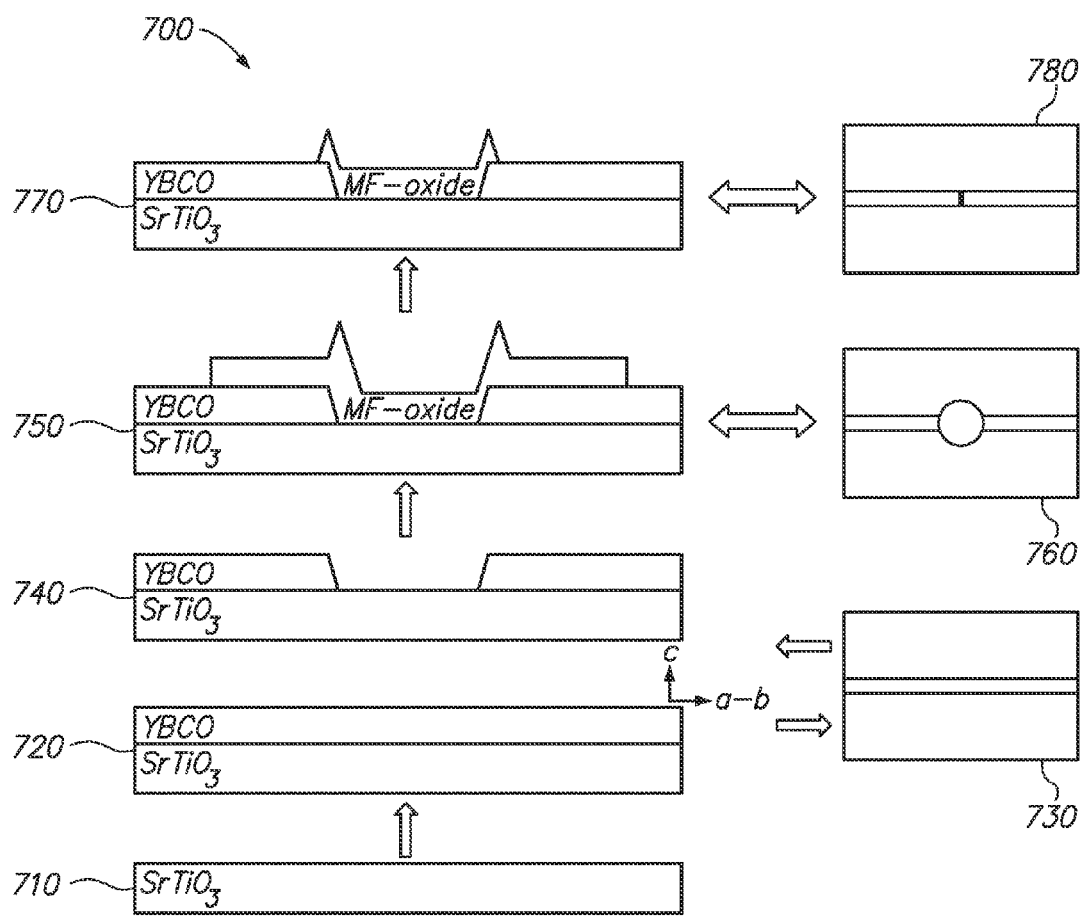
FIGS. 8 and 9 show diagrams illustrating embodiments of methods for manufacturing a device comprising a substrate having a superconducting material with an in-plane tunnel junction with multiferroic properties, where the junction material is directly in the path of an electric current tunneling in the an A-B plane of the superconductor material.
Figure 9:
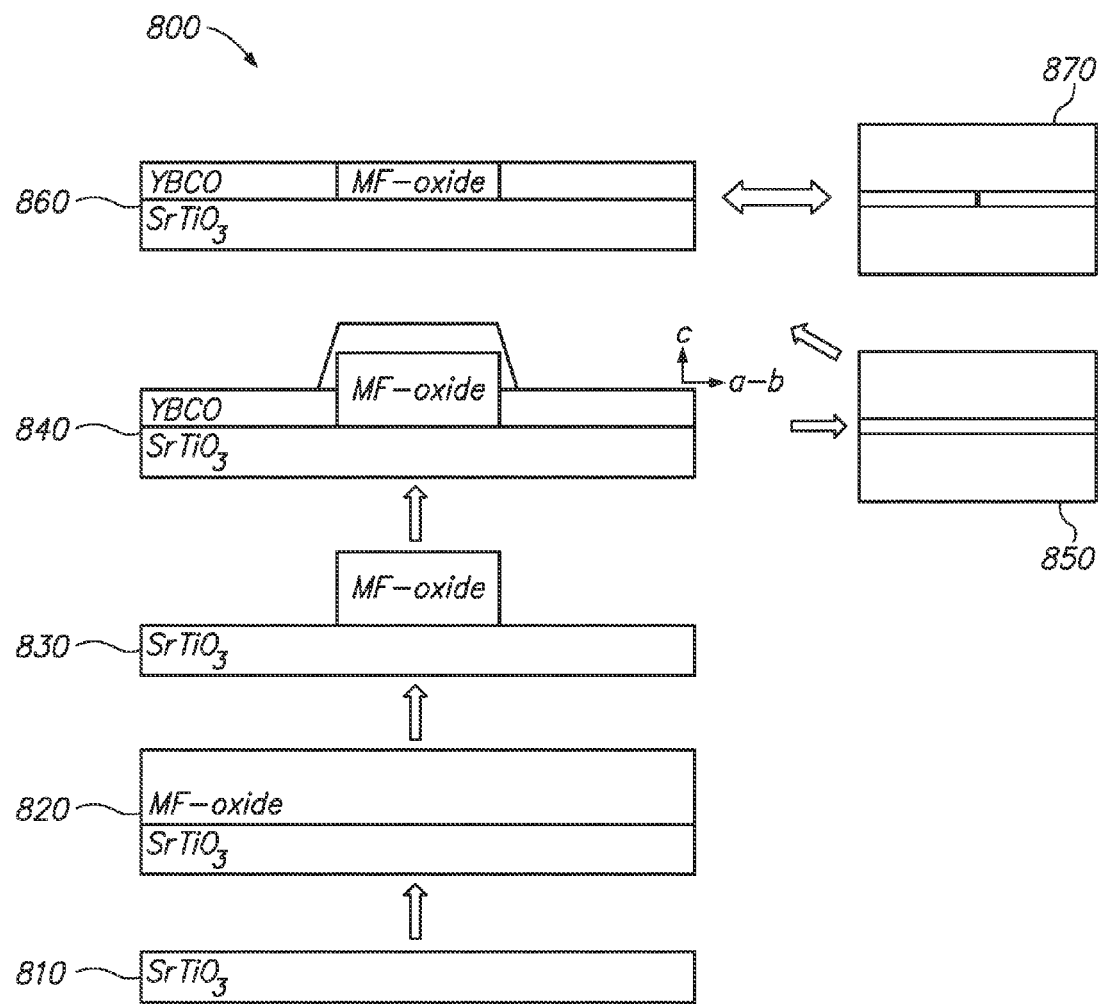

FIGS. 8 and 9 show diagrams 700 and 800 illustrating embodiments of methods for manufacturing a device comprising a substrate having a superconducting material with an in-plane tunnel junction with electromagnetic-responsive properties, where the junction material is directly in the path of an electric current tunneling in the an A-B plane of the superconductor material.

Referring to FIG. 8, the process begins at step 710 which involves creating a $SrTiO_3$ substrate. Step 720 involves depositing a YBCO film on the substrate. Step 730 involves photo/e-beam lithographic etching of YBCO film to form current paths/structures where superconducting tunneling junctions are to be created. Step 740 involves ion milling of YBCO to form a break in the structure. Step 750 involves deposition of multiferroic nano-scale dots over the break region using a method such as the nano-stencil method, as shown in top view 760. Step 770 involves ion milling of the nano-dots to reduce their size to that of the superconducting tunneling junction region, as shown in top view 780.

Referring to FIG. 9, the process begins at step 810 which involves creating a $SrTiO_3$ substrate. Step 820 involves depositing a multiferroic film at least three times as thick as the following YBCO layer. Step 830 involves photo/e-beam lithographic etching of multiferroic film to form nano-dot structures where superconducting tunneling junctions are to be created. Step 840 involves deposition of YBCO film. Step 850 involves photo/e-beam lithographic etching of YBCO film to form current paths/structures where superconducting tunneling junctions are to be created. Step 860 involves ion milling of the superconducting tunneling region to remove the raised portion of the nano-dot/YBCO structure, yielding the device shown in top view 870.

Figure 10:
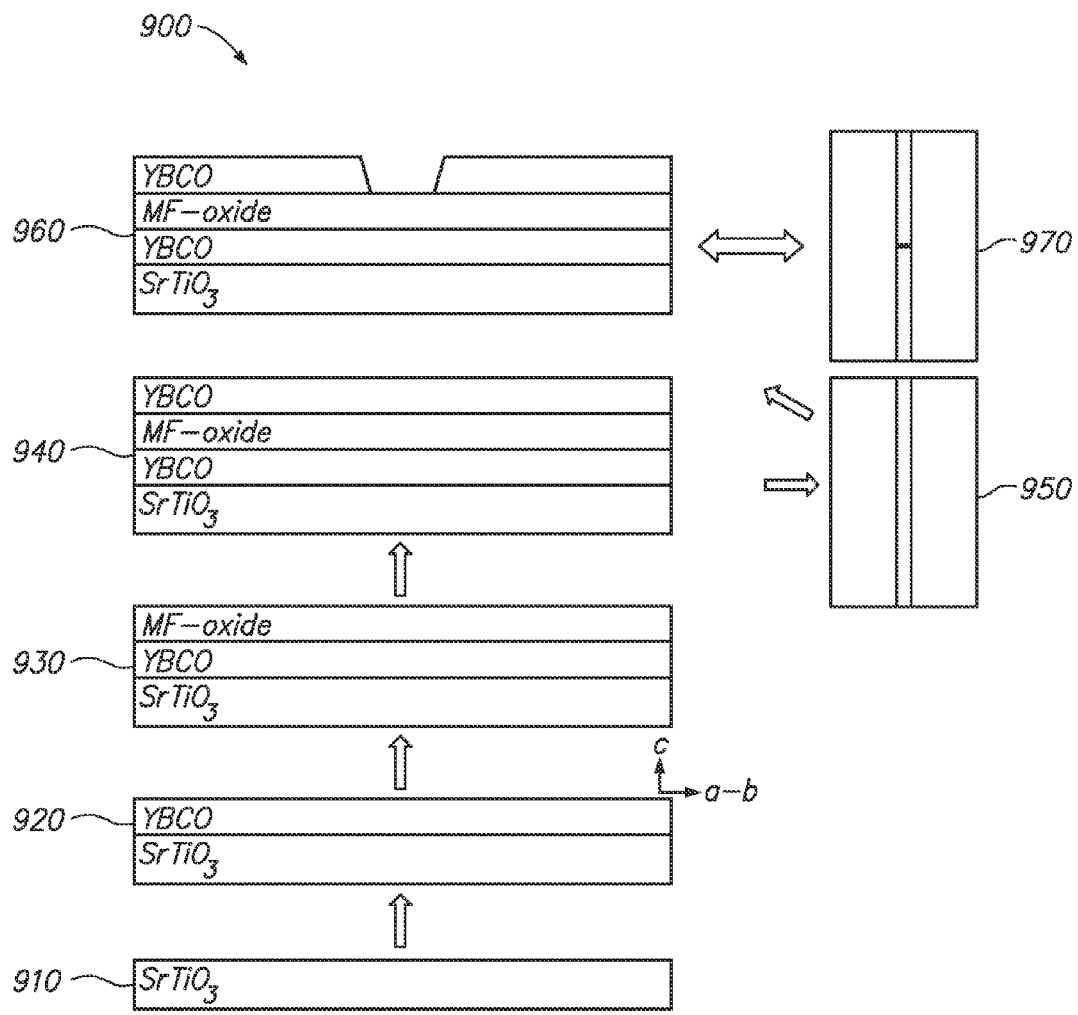
FIGS. 10 and 11 show diagrams illustrating embodiments of methods for manufacturing a device comprising a substrate having a superconducting material with an in-plane tunnel junction with multiferroic properties, where the junctions are formed such that the tunneling current must flow out of or into the superconductor material in a C-axis direction.
Figure 11:
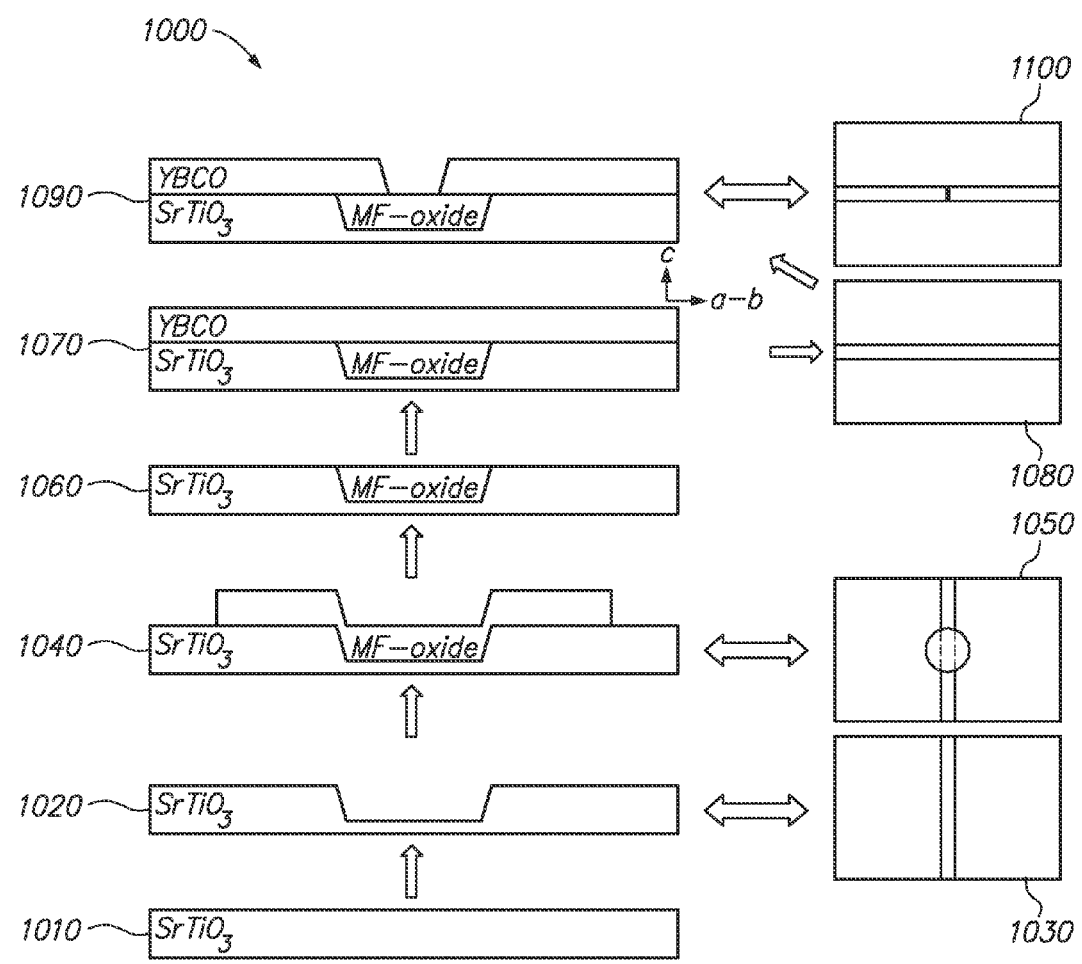

FIGS. 10 and 11 show diagrams 900 and 1000 illustrating embodiments of methods for manufacturing a device comprising a substrate having a superconducting material with an in-plane tunnel junction with multiferroic properties, where the junctions are formed such that the tunneling current must flow out of or into the superconductor material in a c-axis direction.

Referring to FIG. 10, the process begins at step 910 which involves creating a $SrTiO_3$ substrate. Step 920 involves deposition of a layer of YBCO. Step 930 involves deposition of a multiferroic layer on the YBCO. Step 940 involves deposition of second layer of YBCO on the multiferroic layer. Step 950 involves photo/e-beam lithographic etching of YBCO film to form current paths/structures where superconducting tunneling junctions are to be created. Step 960 involves ion milling of the top layer of YBCO to form a break in the structure as shown in top view 970, so that current must tunnel through the underlying layer of multiferroic material.

Referring to FIG. 11, the process begins at step 1010 which involves creating a $SrTiO_3$ substrate. Step 1020 involves ion milling of the substrate material to form a trench region, as shown in top view 1030, with a depth sufficient to grow a multiferroic film thick enough to retain bulk physical properties. Step 1040 involves deposition of multiferroic nano-scale dots over the trench region using a nano-stencil method, as shown in top view 1050. Step 1060 involves ion milling of the nano-dots to reduce their size to that of the trench region. Step 1070 involves deposition of a YBCO film. Step 1080 involves photo/e-beam lithographic etching of YBCO film to form current paths/structures where superconducting tunnel junctions are to be created. Step 1090 involves ion milling of the YBCO layer to form a break in the structure as shown in top view 1100 so that current must tunnel through the underlying layer of multiferroic material.

For the processes described above in FIGS. 8-11, the films may be deposited by various well-known methods currently available including pulsed laser deposition, thermal evaporation, etc. The circuitry paths may be formed using many different available lithographic processes. Further, the ion milling process should preferably use ions of inert atoms, such as argon or helium. Further, while the processes were discussed using films consisting of $SrTiO_3$ as a substrate and $YBa_2Cu_3O_{7-\delta}$ (YBCO) as the high-$T_c$ superconducting material, many other appropriate substrate materials may be used, as well as other high-$T_c$ superconductors.

Many modifications and variations of the Electronic Circuitry Having Superconducting Tunnel Junctions with Functional Electromagnetic Responsive Tunneling Regions are possible in light of the above description. Within the scope of the appended claims, the embodiments of the systems described herein may be practiced otherwise than as specifically described. The scope of the claims is not limited to the implementations and the embodiments disclosed herein, but extends to other implementations and embodiments as may be contemplated by those having ordinary skill in the art.

I claim:

1. A device comprising:
   at least one superconducting tunnel junction having a junction region comprising a junction barrier material having physical properties that change under exposure to electromagnetic fields within the MHz to THz frequency range, wherein the change tunes a characteristic performance of the superconducting tunnel junction.

2. The device of claim 1, wherein the at least one superconducting tunnel junction is contained within a superconducting quantum interference device (SQUID) loop.

3. The device of claim 2, wherein the SQUID loop is a bi-SQUID loop.

4. The device of claim 3, wherein the at least one superconducting tunnel junction comprises at least two main junctions and a center junction, wherein the multiferroic superconducting junction barrier material for the main junctions has different electromagnetic-responsive properties than the multiferroic superconducting junction barrier material for the center junction.

5. The device of claim 1, wherein the physical properties comprise frequency-dependent properties.

6. The device of claim 1, wherein the multiferroic superconducting junction barrier material is selected from the group of naturally-occurring multiferroics consisting of type-I multiferroics and type-II multiferroics.

7. The device of claim 1, wherein the superconducting junction barrier material comprises a composite multiferroic material that includes layers of known magnets and ferroelectrics.

8. The device of claim 1, wherein the superconducting junction barrier material comprises a piezoelectric material.

9. A device comprising:
   a plurality of connected SQUID loops, wherein each SQUID loop comprises at least one superconducting tunnel junction having a junction region comprising a junction barrier material having physical properties that change under exposure to electromagnetic fields ranging from MHz to THz frequencies, wherein the change tunes a characteristic performance of the superconducting tunnel junction.

10. The device of claim 8, wherein each SQUID loop is a bi-SQUID loop, wherein the at least one superconducting tunnel junction for each bi-SQUID loop comprises at least two main junctions and a center junction.

11. The device of claim 10, wherein for each bi-SQUID loop the junction barrier material for the main junctions has different electromagnetic-responsive properties than the junction barrier material for the center junction.

12. The device of claim 10, wherein the main junctions of each bi-SQUID loop are directly connected to an input signal line.

13. The device of claim 12, wherein for each bi-SQUID loop the junction barrier material for the main junctions has different electromagnetic-responsive properties than the junction barrier material for the center junction.

14. The device of claim 10, wherein the center junctions of each bi-SQUID loop are directly connected to an input signal line.

15. The device of claim 14, wherein for each bi-SQUID loop the junction barrier material for the main junctions has different electromagnetic-responsive properties than the junction barrier material for the center junction.

16. A device comprising:
    an array comprising m rows and n columns of connected bi-SQUID loops, wherein each bi-SQUID loop comprises at least one superconducting tunnel junction having a junction region comprising a multiferroic superconducting junction barrier material having physical properties that change under exposure to electromagnetic fields ranging from MHz to THz frequencies, wherein the change tunes a characteristic performance of the superconducting tunnel junction.

17. The device of claim 16, wherein the at least one superconducting tunnel junction for each bi-SQUID loop comprises at least two main junctions and a center junction, wherein the multiferroic superconducting junction barrier material for the main junctions has different electromagnetic-responsive properties than the multiferroic superconducting junction barrier material for the center junction.

18. The device of claim 16, wherein the main junctions of each bi-SQUID loop in each of the m rows are directly connected to an input signal line.

19. The device of claim 18, wherein the electromagnetic-responsive properties of the multiferroic superconducting junction barrier material for the center junctions of each bi-SQUID loop varies by each of the n columns.

20. The device of claim 18, wherein the electromagnetic-responsive properties of the multiferroic superconducting junction barrier material for the center junctions of each bi-SQUID loop varies by each of the m rows.

* * * * *